United States Patent
Ratnakar Aravind et al.

(10) Patent No.: US 7,969,337 B2
(45) Date of Patent: Jun. 28, 2011

(54) SYSTEMS AND METHODS FOR TWO TIER SAMPLING CORRECTION IN A DATA PROCESSING CIRCUIT

(75) Inventors: Nayak Ratnakar Aravind, Lancaster, PA (US); James A. Bailey, Snowflake, AZ (US); Robert H. Leonowich, Fleetwood, PA (US)

(73) Assignee: LSI Corporation, Milpitas, CA (US)

( * ) Notice: Subject to any disclaimer, the term of this patent is extended or adjusted under 35 U.S.C. 154(b) by 44 days.

(21) Appl. No.: 12/510,222

(22) Filed: Jul. 27, 2009

(65) Prior Publication Data

US 2011/0018748 A1  Jan. 27, 2011

(51) Int. Cl.
*H03M 1/00* (2006.01)

(52) U.S. Cl. .................................... 341/123; 455/226.4

(58) Field of Classification Search .................. 341/123, 341/142, 120, 118; 375/232, 229, 268, 355; 455/226.4; 708/316
See application file for complete search history.

(56) References Cited

U.S. PATENT DOCUMENTS

| | | |
|---|---|---|
| 5,262,904 A | 11/1993 | Tang et al. |
| 5,357,520 A | 10/1994 | Arnett et al. |
| 5,493,454 A | 2/1996 | Ziperovich et al. |
| 5,517,146 A | 5/1996 | Yamasaki |
| 5,583,705 A | 12/1996 | Ziperovich et al. |
| 5,781,358 A | 7/1998 | Hasegawa |
| 5,986,830 A | 11/1999 | Hein |
| 5,999,355 A | 12/1999 | Behrens et al. |
| 6,043,942 A | 3/2000 | Cunningham et al. |
| 6,091,560 A | 7/2000 | Du |
| 6,130,794 A | 10/2000 | Christensen |
| 6,134,691 A | 10/2000 | Hirasaka |
| 6,141,168 A | 10/2000 | Takahashi et al. |
| 6,147,828 A | 11/2000 | Bloodworth et al. |
| 6,181,505 B1 | 1/2001 | Sacks et al. |
| 6,208,481 B1 | 3/2001 | Spurbeck et al. |
| 6,212,024 B1 | 4/2001 | Igarashi et al. |
| 6,243,031 B1 | 6/2001 | Jusuf et al. |
| 6,246,723 B1 | 6/2001 | Bliss et al. |

(Continued)

FOREIGN PATENT DOCUMENTS

GB    2 320 866    6/1997

OTHER PUBLICATIONS

U.S. Appl. No. 12/199,325, filed Aug. 27, 2008, Mathew.

(Continued)

*Primary Examiner* — Joseph Lauture
(74) *Attorney, Agent, or Firm* — Hamilton, DeSanctis & Cha LSI (57) ABSTRACT

Various embodiments of the present invention provide systems and methods for data processing. For example, a data processing circuit is disclosed that includes an analog to digital converter, a digital interpolation circuit, a phase error circuit, and a phase adjustment control circuit. The analog to digital converter samples an analog data input at a sampling phase governed at least in part by a coarse control, and provides a series of digital samples. The digital interpolation circuit interpolates between a subset of the series of digital samples based at least in part on a fine control. The phase error circuit calculates a phase error value. The phase adjustment control circuit is operable to determine the coarse control and the fine control based at least in part on the phase error value.

29 Claims, 7 Drawing Sheets

U.S. PATENT DOCUMENTS

| | | |
|---|---|---|
| 6,337,778 B1 | 1/2002 | Gagne |
| 6,396,651 B1 | 5/2002 | Grover |
| 6,404,572 B1 | 6/2002 | Hong |
| 6,535,345 B1 | 3/2003 | Shimoba |
| 6,563,655 B1 | 5/2003 | Yamasaki et al. |
| 6,621,648 B2 | 9/2003 | Elliott et al. |
| 6,662,303 B1 | 12/2003 | Toosky et al. |
| 6,671,244 B2 | 12/2003 | Honma |
| 6,674,590 B2 | 1/2004 | Ottesen et al. |
| 6,678,230 B2 | 1/2004 | Miyashita et al. |
| 6,721,114 B1 | 4/2004 | Sutardja et al. |
| 6,788,481 B2 | 9/2004 | Fang et al. |
| 6,894,854 B1 | 5/2005 | Carlson et al. |
| 6,912,682 B1 | 6/2005 | Aoki |
| 6,934,100 B2 | 8/2005 | Ueno |
| 6,937,415 B2 | 8/2005 | Galbraith et al. |
| 7,012,772 B1 | 3/2006 | Vis |
| 7,079,342 B1 | 7/2006 | Han et al. |
| 7,092,179 B2 | 8/2006 | Yamanouchi |
| 7,123,429 B2 | 10/2006 | Musungu et al. |
| 7,126,773 B1 | 10/2006 | Taratorin |
| 7,193,802 B2 | 3/2007 | Cideciyan et al. |
| 7,248,424 B2 | 7/2007 | Ueno |
| 7,256,954 B2 | 8/2007 | Serizawa et al. |
| 7,262,928 B1 | 8/2007 | Oberg |
| 7,271,753 B1 | 9/2007 | Padukone et al. |
| 7,308,057 B1 | 12/2007 | Patapoutian |
| 7,440,224 B2 | 10/2008 | Ehrlich et al. |
| 7,495,854 B2 | 2/2009 | Hutchins |
| 7,542,227 B2 | 6/2009 | Che et al. |
| 7,715,135 B1 | 5/2010 | Sutardja et al. |
| 7,733,591 B2 | 6/2010 | Bottemiller et al. |
| 2002/0159350 A1 | 10/2002 | Ogura |
| 2003/0026354 A1 | 2/2003 | Chang et al. |
| 2003/0048564 A1 | 3/2003 | Koller et al. |
| 2005/0117243 A1 | 6/2005 | Serizawa et al. |
| 2006/0061496 A1 | 3/2006 | Chang et al. |
| 2006/0062125 A1 | 3/2006 | Horie et al. |
| 2006/0176947 A1 | 8/2006 | Lim |
| 2007/0041115 A1 | 2/2007 | Lee |
| 2007/0047120 A1 | 3/2007 | DeGroat |
| 2007/0076313 A1 | 4/2007 | Hutchins et al. |
| 2007/0140088 A1 | 6/2007 | Hino et al. |
| 2008/0031114 A1 | 2/2008 | Hong et al. |
| 2008/0032652 A1 * | 2/2008 | Zhao et al. ............... 455/226.4 |
| 2008/0037153 A1 | 2/2008 | Yoshizawa |
| 2008/0081382 A1 | 4/2008 | Yang et al. |
| 2009/0033680 A1 | 2/2009 | Lee et al. |
| 2009/0161245 A1 | 6/2009 | Mathew |
| 2009/0230639 A1 | 9/2009 | Van Cayzeele |

OTHER PUBLICATIONS

U.S. Appl. No. 12/273,265, filed Nov. 18, 2008, Mathew.
U.S. Appl. No. 12/337,775, filed Dec. 18, 2008, Mathew.
U.S. Appl. No. 12/337,805, filed Dec. 18, 2008, Mueller.
U.S. Appl. No. 12/337,828, filed Dec. 18, 2008, Mueller.
U.S. Appl. No. 12/337,850, filed Dec. 18, 2008, Mueller.
U.S. Appl. No. 12/348,236, filed Jan. 2, 2009, Liu.
U.S. Appl. No. 12/371,906, filed Feb. 16, 2009, Ratnakar Aravind.
U.S. Appl. No. 12/430,948, filed Apr. 28, 2009, Grundvig.
Cho and Lee, "An Estimation Technique for Nonlinear Distortion in High Density Magnetic Recording Channels", IEEE Transactions on Magnetics, vol. 34, No. 1, pp. 40-44 Jan. 1998.
Degroat et al., "Experimental Characterization of Media Noise Based on Equalized Synchronized Drive Data", IEEE Trans. Magnetics, vol. 37, No. 2, pp. 633-638, Mar. 2001.
Farhang-Boroujeny, Adaptive Filters: Theory and Applications. John Wiley & Sons Ltd, 1998, Chapter 11. pp. 373-379.
Kavcic and Patapoutian, "A Signal-Dependent Autoregressive Channel Model", IEEE Trans. Magnetics, vol. 35 No. 5, pp. 2316-2318, Sep. 1999.
Lin et al. "An estimation technique for accurately modelling the magnetic recording channel including nonlinearities." IEEE Trans. Mag, vol. 25, No. 5, pp. 4084-4086, Sep. 1989.
Moon, J., "Signal-to-Noise Ratio Definition for Magnetic Recording Channels With Transition Noise", IEEE Trans. Magnetics, vol. 36, No. 5, pp. 3881-3883, Sep. 2000.
Palmer et al, "Identification of nonlinear write effects using pseudo-random sequences" IEEE Trans. Magnetics, vol. 23 No. 5, pp. 2377-2379, Sep. 1987.
Partovi; et al., "Flow-Through Latch and Edge-Triggered Flip-Flop Hybrid Elements"; Feb. 8, 1996; pp. 138-139; Solid-State Circuits Conf Digest of Technical Papers IEEE.
Tokumasu et al. "A New Reduced Clock-Swing Flip-Flop (NDKFF)," Corporate Research & Development Center, Toshiba Corporation. IEEE Feb. 2002 Custom Intergrated Circuits Conf.
Wood and Donaldson, "The Helical-Scan Magnetic Tape Recorder as a Digital Communication Channel", IEEE Transactions on Magnetics, vol. MAG-15, No. 2, pp. 935-943 Mar. 1979.

* cited by examiner

SYSTEMS AND METHODS FOR TWO TIER SAMPLING CORRECTION IN A DATA PROCESSING CIRCUIT

BACKGROUND OF THE INVENTION

The present inventions are related to systems and methods for transferring information, and more particularly to systems and methods for updating sampling frequencies in relation to data transfer.

Various products including hard disk drives typically utilize a read channel device that provides an ability to retrieve information from a medium in one format, and provide it to a recipient in a digital data format. Such read channel devices include an analog to digital converter along with a data detector circuit implemented such that data dependencies may be used to process received information. For example, the information provided from the data detector may be used to determine the sampling points of the analog to digital converter. The ability to establish an accurate sample of received data is important to the accurate transfer of data.

The push toward low-cost, high-performance data transfer systems is resulting in tight constraints on are and power dissipation of the read channel circuits. At the same time, there is a corresponding push to transfer higher density data patterns. This often requires detection of transferred data in a reduced signal to noise ratio environment. In this environment, current sampling correction frequency circuits may not offer sufficient accuracy.

Hence, for at least the aforementioned reasons, there exists a need in the art for advanced systems and methods for performing updating sampling frequencies.

BRIEF SUMMARY OF THE INVENTION

The present inventions are related to systems and methods for transferring information, and more particularly to systems and methods for updating sampling frequencies in relation to data transfer.

Various embodiments of the present invention provide data processing circuits that include an analog to digital converter, a digital interpolation circuit, a phase error circuit, and a phase adjustment control circuit. The analog to digital converter samples an analog data input at a sampling phase governed at least in part by a coarse control, and provides a series of digital samples. The digital interpolation circuit interpolates between a subset of the series of digital samples based at least in part on a fine control. The phase error circuit calculates a phase error value. The phase adjustment control circuit is operable to determine the coarse control and the fine control based at least in part on the phase error value.

In some instances of the aforementioned embodiments, the circuit further includes a data processing circuit that receives a digital data input derived from the digital interpolation circuit and provides a processed output. In such instances, the phase error circuit receives the digital data input derived from the digital interpolation circuit and the processed output, and the phase error circuit calculates the phase error value based at least in part on a difference between the digital data input derived from the digital interpolation circuit and the processed output. In some such instances, the data processing circuit includes a data detection circuit that may be, but is not limited to, a Viterbi algorithm detector or a MAP detector.

In particular instances of the aforementioned embodiments, the phase adjustment control circuit includes a coarse tune error feedback circuit and a fine tune error feedback circuit. The coarse tune feedback circuit generates the coarse control based at least in part on the phase error value, and the fine tune error feedback circuit generates the fine control based at least in part on a residual value provided from the coarse tune feedback signal. In some such instances, the phase adjustment control circuit includes a latency adjustment circuit that is operable to reduce the effect of a latency difference between applying the coarse control and applying the fine control. In some cases, the latency adjustment circuit includes a low pass filter and a summation circuit. The low pass filter provides an average value of the fine control to a summation element where it is summed with the phase error value to yield a modified error value, and the coarse tune feedback circuit generates the coarse control based at least in part on the modified error value. In other cases, the latency adjustment circuit includes a delay circuit that delays application of the fine control to the digital interpolation circuit to match any delay in propagating the coarse control to the series of data samples provided to the digital interpolation filter.

In various instances of the aforementioned embodiments, the digital interpolation circuit is operable to compensate for a discontinuity between two of the subset of the series of digital samples caused by a change in the coarse control. In some cases, the digital interpolation circuit includes a lookup table with pre-calculated fine select values selectable based upon the fine control and a change in the coarse control. In one or more instances of the aforementioned embodiments, the circuit further includes a slew rate limiting circuit that limits an incremental change that may be made to the coarse control by the phase adjustment control circuit.

Other embodiments of the present invention provide methods for sample phase adjustment in a data processing system. Such methods include performing an analog to digital conversion of an analog data input at a sampling phase governed at least in part by a coarse control, and yielding a series of digital samples; performing a digital interpolation of the series of digital samples that interpolates between a subset of the series of digital samples based at least in part on a fine control and yields a series of interpolated values; performing a data detection on a derivative of the series of interpolated values to yield an ideal output; calculating a phase error based at least in part on the ideal output and the derivative of the series of interpolated values; updating the coarse control based at least in part on the phase error; calculating a residual value based at least in part on the phase error; and updating the fine control based at least in part on the residual value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for transferring information, and more particularly to systems and methods for updating sampling frequencies in relation to data transfer.

Various embodiments of the present invention provide two-tier sampling phase adjustment circuits. In the circuits, a coarse phase adjustment is performed in the analog domain by modifying the sampling phase of an analog to digital converter, and a fine phase adjustment is performed in the digital domain by modifying the interpolation phase of a digital interpolation circuit. As just some advantages, the aforementioned approach allow for relaxing the requirements placed on sampling by the analog to digital converter that in some cases cannot be met, while at the same time reducing the range over which a digital interpolation is performed. Such a reduction in range increases the accuracy of the digital interpolation. In some cases, various circuitry is employed to assure that changes to sampling phase implemented in the digital domain are done at approximately the same time that changes in the sampling phase implemented in the analog domain are done.

Figure 1A:
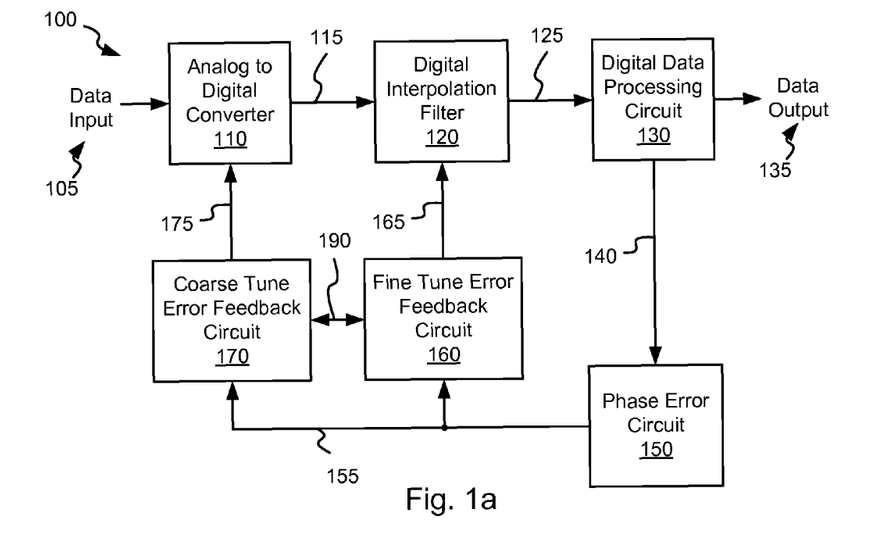
FIG. 1a depicts a two-tier sampling phase update circuit in accordance with one or more embodiments of the present invention.

Turning to FIG. 1a, a data processing system 100 including a two-tier sampling phase update circuit is shown in accordance with one or more embodiments of the present invention. Data processing system 100 includes an analog to digital converter 110 that receives a data input 105. Data input 105 is an analog data input that presents serial information to analog to digital converter 110. Data input 105 may be derived, for example, from a magnetic storage medium or from a transmission device. Based upon the disclosure provided herein, one of ordinary skill in the art will recognize a variety of sources from which data input 105 may be derived.

Analog to digital converter 110 samples data input 105 at a sampling phase governed by a coarse phase feedback signal 175. Analog to digital converter 110 may be any type of analog to digital converter known in the art. A series of digital samples 125 is provided from analog to digital converter 110 to a digital interpolation filter 120. Interpolation filter 120 selects one of a number of different samples corresponding to different phases depending upon a fine phase feedback signal 165. Interpolation filter 120 yields an interpolated output 125. An example of an interpolator circuit that may be used in place of interpolation filter 120 is depicted in FIG. 1b.

Figure 1B:
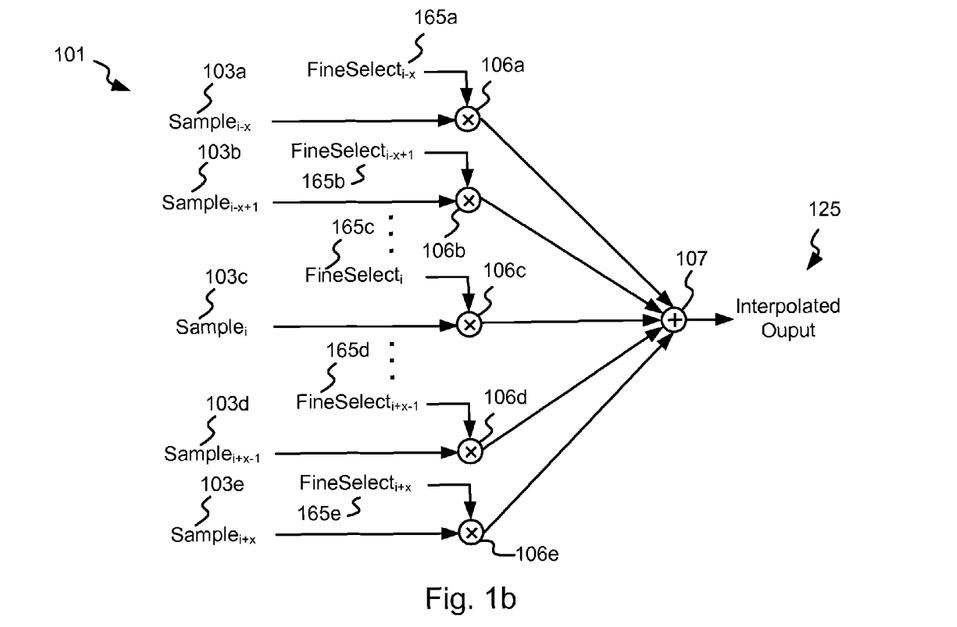
FIG. 1b depicts an exemplary digital interpolator circuit that may be used in relation to different embodiments of the present invention.

Turning to FIG. 1b, an exemplary digital interpolator circuit 101 that may be used in relation to different embodiments of the present invention is shown. Digital interpolator circuit 101 includes a number of multiplier circuits 106, where the number of multiplier circuits 106 corresponds to the number of possible samples 103 and the number of fine phase feedback signals 165. Multiplier circuits 106 multiply respective ones of fine phase feedback signals 165 by samples 103. The products of the respective multiplications are summed together using a summation circuit 107 to yield interpolated output 125. As an example, where fine phase feedback signals 165 are asserted such that fine phase feedback signal 165d and fine phase feedback signal 165e are both set to a value of 0.5, and the other instances of fine phase feedback signals 165 are set to a value of '0', interpolated output 125 is the average of sample 103d and sample 103e. It should be noted that other interpolation circuits may be used in place of interpolation filter in accordance with different embodiments of the present invention.

Returning to FIG. 1a, interpolated output 125 is provided to a digital data processing circuit 130 that performs various processing steps on the input. Digital data processing circuit 130 may include, but is not limited to digital data detection and/or digital data decoding as are known in the art. For example, digital data processing circuit 130 may include a MAP data detector and a low density parity check decoder as are known in the art. Based upon the disclosure provided herein, one of ordinary skill in the art will recognize a variety of data processing circuits that may be employed in relation to different embodiments of the present invention. Digital data processing circuit 130 provides a data output 135.

In addition, digital data processing circuit 130 provides a combination of pre-processed information and post processed information 140 to a phase error circuit 150. Phase error circuit 150 compares the pre-processed information with the post processed information to provide a phase offset value 155. Phase offset value 155 represents an overall phase adjustment that would be expected to yield an ideal signal at the output of digital interpolation filter 120. A phase change corresponding to phase offset value 155 is implemented in part by a coarse tune error feedback circuit 170 and in part by a fine tune error feedback circuit 160. Coarse tune feedback circuit 170 is operable to adjust the sampling phase at analog to digital converter 110 in increments of a "coarse step", and fine tune feedback circuit 160 is operable to adjust the sampling phase at digital interpolation filter 120 in increments of a "fine step". Each sampling period (T) may be divided into four coarse sampling periods, and each of the coarse sampling periods may be divided into eight fine sampling periods that when combined yield the overall sampling precision that can be achieved. Based upon the disclosure provided herein, one of ordinary skill in the art will recognize a variety of other combinations of phase shifts that may be accomplished in accordance with different embodiments of the present invention. A communication signal 190 between coarse tune error feedback circuit 170 and fine tune error feedback circuit 160 allows for balancing any phase offset between coarse phase feedback signal 175 and fine phase feedback signal 165.

The following pseudocode represents the operation of the combination of coarse tune error feedback circuit 170 and fine tune error feedback circuit 160 to yield the desired phase offset correction:

```
/* Preliminary Coarse Adjustment */
If (Phase Offset Value 155 > 0){
    If (|Phase Offset Value 155| > ½ Coarse Step){
        Coarse Phase Feedback Signal 175 = Coarse Phase Feedback
            Signal 175 +1;
        Updated Phase Offset Value = Phase Offset Value 155 – Coarse Step
    }
    Else {
        Coarse Phase Feedback Signal 175 = Coarse Phase
            Feedback Signal 175;
        Updated Phase Offset Value = Phase Offset Value 155
    }
Else {
    If (|Phase Offset Value 155| > ½ Coarse Step){
        Coarse Phase Feedback Signal 175 = Coarse Phase
            Feedback Signal 175 –1;
        Updated Phase Offset Value = Phase Offset Value
            155 + Coarse Step
    }
    Else {
        Coarse Phase Feedback Signal 175 = Coarse
            Phase Feedback Signal 175;
        Updated Phase Offset Value = Phase Offset Value 155
    }
/* Subsequent Fine Adjustment */
If (Phase Offset Value 155 > 0){
    If (|Updated Phase Offset Value| > Coarse Step){
        Set Fine Feedback Signal 165 to Maximum
    }
    Else {
        Set Fine Feedback Signal 165 to match Updated Phase Offset Value
    }
Else {
    If (|Updated Phase Offset Value| > Coarse Step){
        Set Fine Feedback Signal 165 to Minimum
    }
    Else {
        Set Fine Feedback Signal 165 to match Updated Phase Offset Value
    }
```

Of note, coarse phase feedback signal is only allowed to move one increment either positive or negative at a given time. This is done to maintain loop stability. It should be noted that more or less slew rate limiting may be enforced in accordance with different embodiments of the present invention.

Figure 2:
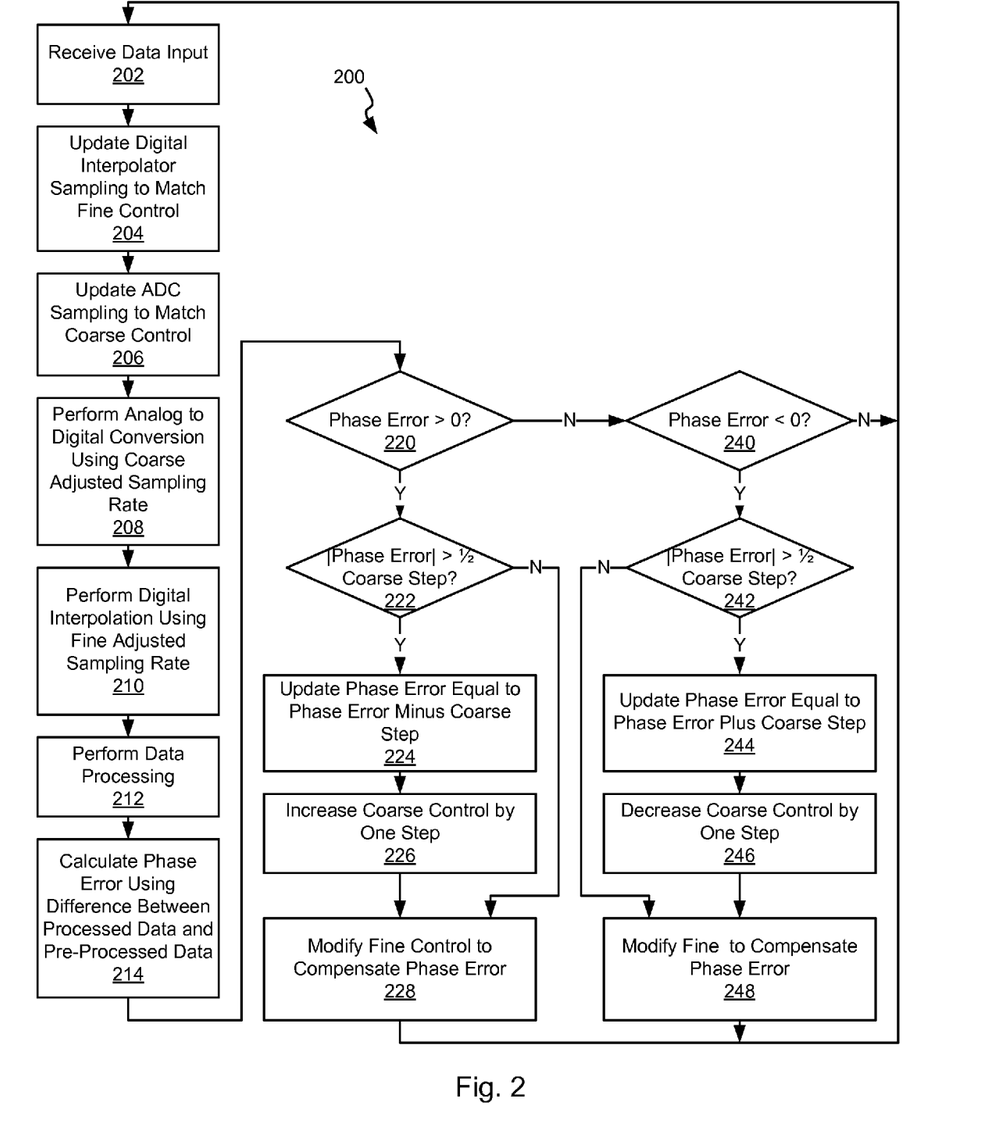
FIG. 2 is a flow diagram showing a method in accordance with some embodiments of the present invention for updated two sampling phases in accordance with various embodiments of the present invention.

Turning to FIG. 2, a flow diagram 200 shows a method in accordance with some embodiments of the present invention for updated two sampling phases in accordance with various embodiments of the present invention. Following flow diagram 200, a data input is received (block 202). The data input is an analog data input that represents a series of information. The data input may be derived, for example, from a magnetic storage medium or from a transmission device. Based upon the disclosure provided herein, one of ordinary skill in the art will recognize a variety of sources from which data input 105 may be derived. Sampling of a digital interpolator is updated to reflect a fine control signal (block 204), and sampling of an analog to digital converter is updated to reflect a fine control signal (block 206). An analog to digital conversion is performed on the received data input using a sampling rate adjusted to match the coarse control (block 208). The analog to digital conversion yields a series of digital samples corresponding to sampling points with a phase corresponding to the coarse control.

A digital interpolation is performed on the series of digital samples using a sampling rate corresponding to the fine control (block 210). This interpolation modifies the value of a given digital sample adjusted for phase to match the updated fine control. The interpolated data is then processed using one or more data processing techniques known in the art (block 212). Such data processing may include, but is not limited to, a Viterbi algorithm data detection process or a MAP data detection process as is known in the art. The data processing yields an ideal output (i.e., an output with one or more errors corrected). This ideal output can be compared with the interpolated data to determine a phase error (block 214). Determination of such a phase error may be done using any technique known in the art.

It is determined whether the phase error is positive (i.e., a shift later is required) (block 220) or negative (i.e., a shift earlier is required) (block 240). Where the phase error is positive (block 220), it is determined whether the magnitude of the error is greater than one half of a coarse step (block 222). Where the magnitude of the phase error is greater than one half of a coarse step (block 222), the phase error signal is updated to be the original phase error less a coarse step (block 224). In addition, the coarse control is incremented by one causing the analog to digital converter sampling to be moved one full cycle earlier (block 226). The fine control is then adjusted to compensate for the updated phase error (block 228). As an example, where the phase error is three quarters of a coarse step, coarse control is incremented by one and the phase error is change to negative one quarter of a coarse step. The negative one quarter is then compensated by modifying the fine control such that the digital interpolation moves one quarter cycle later. Alternatively, where the magnitude of the phase error is not greater than one half of a coarse step (block 222), the coarse control remains unchanged and the fine control is used to compensate for the phase error (block 228). As an example, where the phase error is one third of a coarse step, the fine control is adjusted to move the digital interpolation one third of a coarse step earlier.

Alternatively, where the phase error is negative (block 240), it is determined whether the magnitude of the error is greater than one half of a coarse step (block 242). Where the magnitude of the phase error is greater than one half of a coarse step (block 242), the phase error signal is updated to be the original phase error plus a coarse step (block 244). In addition, the coarse control is decremented by one causing the analog to digital converter sampling to be moved one full cycle later (block 246). The fine control is then adjusted to compensate for the updated phase error (block 248). As an example, where the phase error is three quarters of a coarse step, coarse control is decremented by one and the phase error is change to positive one quarter of a coarse step. The positive one quarter is then compensated by modifying the fine control such that the digital interpolation moves one quarter cycle earlier. Alternatively, where the magnitude of the phase error is not greater than one half of a coarse step (block 242), the coarse control remains unchanged and the fine control is used to compensate for the phase error (block 248). As an example, where the phase error is one third of a coarse step, the fine control is adjusted to move the digital interpolation one third of a coarse step later.

Of note, coarse phase feedback signal is only allowed to move one increment either positive or negative at a given time. This is done to maintain loop stability. It should be noted that more or less slew rate limiting may be enforced in accordance with different embodiments of the present invention.

Figure 3:
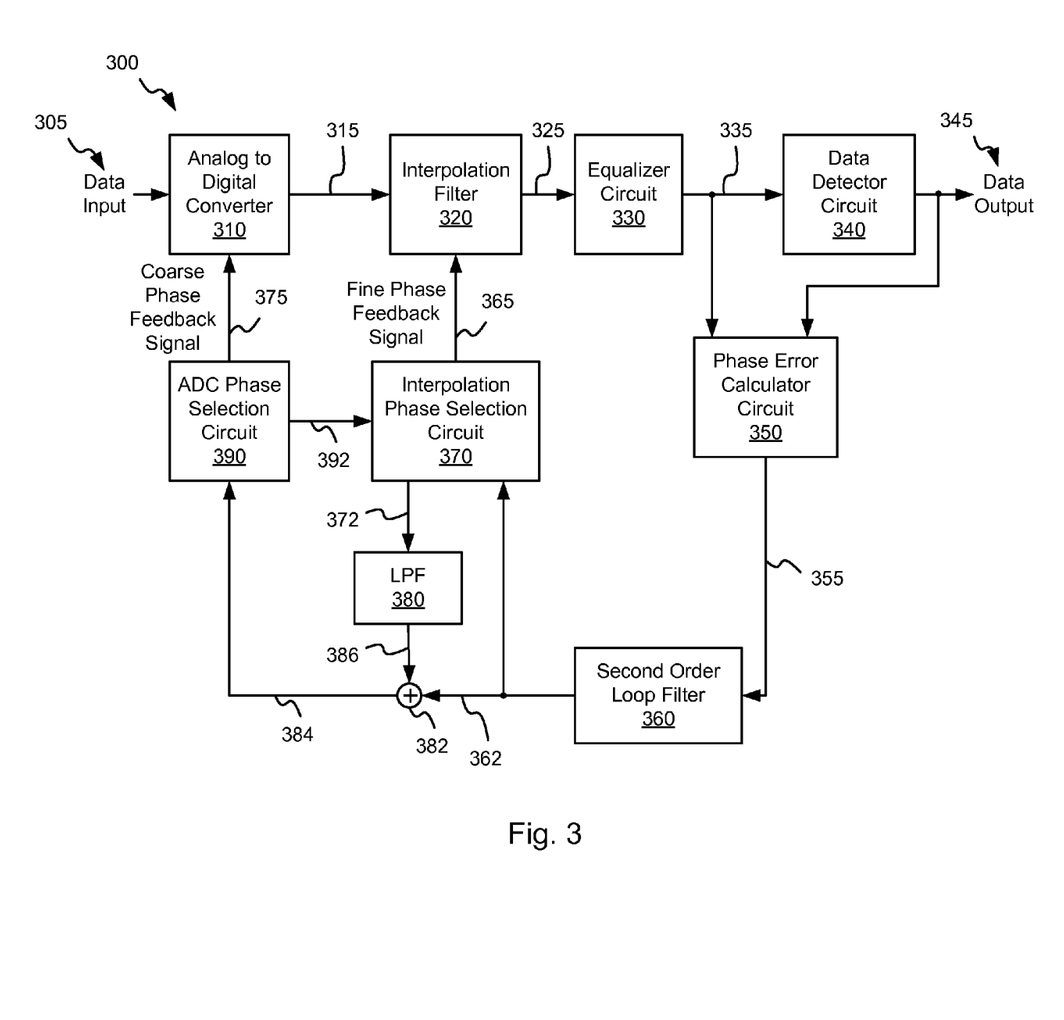
FIG. 3 shows a data processing system including a two-tier sampling phase update circuit in accordance with some embodiments of the present invention.

Turning to FIG. 3, a data processing system 300 including a two-tier sampling phase update circuit is shown in accordance with some embodiments of the present invention. Data processing system 300 compensates for the latency difference between performing a sampling phase update in the analog domain and performing a sampling phase update in the digital domain by incorporating an averaged fine tune adjustment in a the calculation of a coarse tune adjustment. This results in centering the fine tune adjustment around approximately zero, rather than a value driven by the latency difference.

Data processing system 300 includes an analog to digital converter 310 that receives a data input 305. Data input 305 is an analog data input that presents serial information to analog to digital converter 310. Data input 305 may be derived, for example, from a magnetic storage medium or from a transmission device. Based upon the disclosure provided herein, one of ordinary skill in the art will recognize a variety of sources from which data input 305 may be derived.

Analog to digital converter 310 samples data input 305 at a sampling phase governed by a coarse phase feedback signal 375. Analog to digital converter 310 may be any type of analog to digital converter known in the art. A series of digital samples 325 is provided from analog to digital converter 310 to a digital interpolation filter 320. Digital interpolation filter 320 selects one of a number of different samples corresponding to different phases depending upon a fine phase feedback signal 365. Digital interpolation filter 320 yields an interpolated output 325. An example of an interpolator circuit that may be used in place of interpolation filter 320 was discussed above in relation to FIG. 1b, or that described blow in relation to FIG. 6.

Interpolated output 325 is provided to an equalizer circuit 330, that may be any circuit known in the art that is capable of performing an equalizing function. Equalizer circuit 330 provides an original data input 335 to a data detector circuit 340. In addition, original data input 335 is provided to a phase error calculator circuit 350 as are known in the art. Data detector circuit 340 may be any data detector known in the art including, but not limited to, a MAP detector or a Viterbi algorithm detector. Based upon the disclosure provided herein, one of ordinary skill in the art will recognize a variety of data detector circuits that may be used in relation to different embodiments of the present invention. The results of the data detection process are provided from data detector circuit 340 as a data output 345. In addition, data output 345 is provided to phase error calculator circuit 350. Phase error calculator circuit 350 may be any circuit known in the art that is capable of identifying a sampling phase error based upon a difference between a detector input and a detector output. Phase error calculator circuit 350 provides a phase offset value 355 that is filtered by a second order filter 360 to yield a phase error value 362. Phase error value 362 represents an overall phase adjustment that would be expected to yield an ideal signal at the output of digital interpolation filter 320.

A phase change corresponding to phase error value 362 is implemented in part by a ADC phase selection circuit 390 providing a coarse phase feedback signal 375, and in part by an interpolation phase selection circuit 370 providing a fine phase feedback signal 365. ADC phase selection circuit 390 is operable to adjust the sampling phase at analog to digital converter 310 in increments of a "coarse step", and interpolation phase selection circuit 370 is operable to adjust the sampling phase at digital interpolation filter 320 in increments of a "fine step". Each sampling period (T) may be divided into a number of coarse sampling periods, and each of the coarse sampling periods may be divided into a number of fine sampling periods. The sampling resolution is defined by a combination of the fine sampling periods and the coarse sampling periods. Based upon the disclosure provided herein, one of ordinary skill in the art will recognize a variety of combinations of fine sampling periods and coarse sampling periods that may be accomplished in accordance with different embodiments of the present invention.

The magnitude of fine phase feedback signal 365 is provided as an output 372 to a low pass filter circuit 380. Low pass filter circuit 380 calculates an average of fine phase feedback signal 365 over a number of processed samples. As an example, low pass filter 380 maintains a running average of forty consecutive processed samples. The average of fine phase feedback signal 365 is provided as an average output 386 to a summation circuit 382. Summation circuit 382 adds average output 372 to phase error value 362 to yield a modified phase error value 384. By incorporating average output 386 with phase error value 362 any steady state value of fine phase feedback signal 365 due to a difference in the latency in updating coarse phase feedback signal 375 when compared with fine phase feedback signal 365 is subtracted resulting in modified phase error value 384. As such, the steady state value of fine phase feedback signal 365 is approximately zero. This maximizes the adjustment range of fine phase feedback signal 365.

Modified phase error value 384 is provided to ADC phase selection circuit 390 that generates coarse phase feedback signal 375 in proportion to modified phase error value 384. In particular, where the magnitude of modified phase error value 384 is greater than one half of a coarse step, coarse phase feedback signal is incremented or decremented by an amount designed to compensate. For example, where modified phase error value 384 is 0.8 times a coarse step, coarse phase feedback signal 375 is incremented by one leaving the residual adjustment of −0.2 of a coarse step. As another example, where modified phase error value 384 is 1.2 times a coarse step, coarse phase feedback signal 375 is incremented by one leaving the residual adjustment of 0.2 of a coarse step. As yet another example, where modified phase error value 384 is 2.2 times a coarse step, coarse phase feedback signal 375 is incremented by two leaving the same residual adjustment of 0.2 of a coarse step. A similar pattern is true for negative phase adjustments. For example, where modified phase error value 384 is −0.8 times a coarse step, coarse phase feedback signal 375 is decremented by one leaving the residual adjustment of 0.2 of a coarse step. As another example, where modified phase error value 384 is −1.2 times a coarse step, coarse phase feedback signal 375 is decremented by one leaving the residual adjustment of −0.2 of a coarse step. As yet another example, where modified phase error value 384 is 2.2 times a coarse step, coarse phase feedback signal 375 is decremented by two leaving the same residual adjustment of −0.2 of a coarse step.

The residual adjustment is provided to interpolation phase selection circuit 370 as a residual value 392. Interpolation phase selection circuit 370 modifies fine phase feedback signal 365 in accordance with the value of residual value 392, and provides the output as fine phase feedback signal 365.

Figure 4:
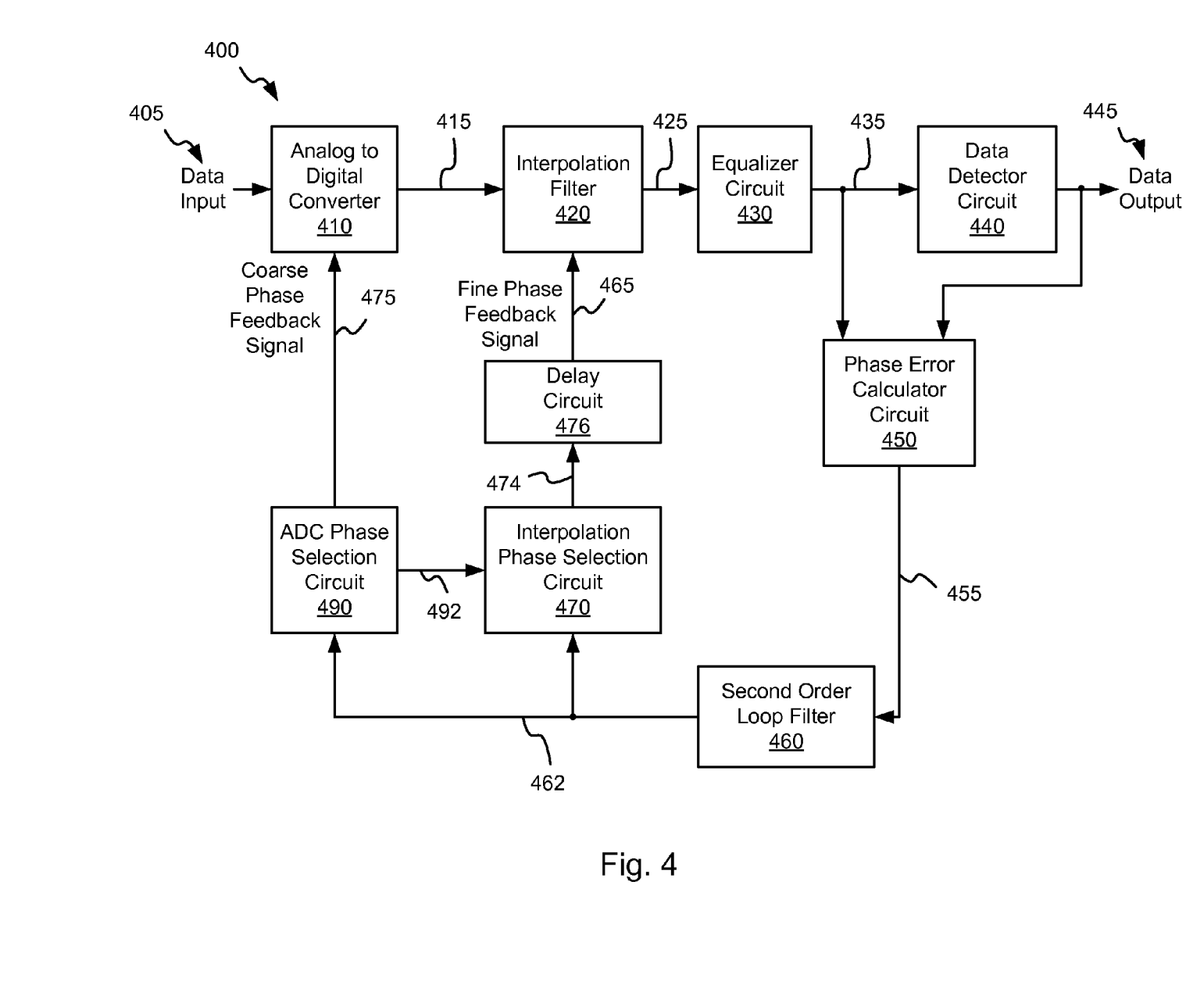
FIG. 4 shows another data processing system including a two-tier sampling phase update circuit in accordance with some embodiments of the present invention.

Turning to FIG. 4, another data processing system 400 including a two-tier sampling phase update circuit is shown in accordance with some embodiments of the present invention. Data processing system 400 compensates for the latency difference between performing a sampling phase update in the analog domain and performing a sampling phase update in the digital domain by delaying implementation of any sampling phase update in the digital domain to match the sampling phase update in the analog domain.

Data processing system 400 includes an analog to digital converter 410 that receives a data input 405. Data input 405 is an analog data input that presents serial information to analog to digital converter 410. Data input 405 may be derived, for example, from a magnetic storage medium or from a transmission device. Based upon the disclosure provided herein, one of ordinary skill in the art will recognize a variety of sources from which data input 405 may be derived.

Analog to digital converter 410 samples data input 405 at a sampling phase governed by a coarse phase feedback signal 475. Analog to digital converter 410 may be any type of analog to digital converter known in the art. A series of digital samples 415 is provided from analog to digital converter 410 to a digital interpolation filter 420. Digital interpolation filter 420 selects one of a number of different samples corresponding to different phases depending upon a fine phase feedback signal 465. Digital interpolation filter 420 yields an interpolated output 425. An example of an interpolator circuit that may be used in place of interpolation filter 420 was discussed above in relation to FIG. 1b, or that described blow in relation to FIG. 6.

Interpolated output 425 is provided to an equalizer circuit 430, that may be any circuit known in the art that is capable of performing an equalizing function. Equalizer circuit 430 provides an original data input 435 to a data detector circuit 440. In addition, original data input 435 is provided to a phase error calculator circuit 450 as are known in the art. Data detector circuit 440 may be any data detector known in the art including, but not limited to, a MAP detector or a Viterbi algorithm detector. Based upon the disclosure provided herein, one of ordinary skill in the art will recognize a variety of data detector circuits that may be used in relation to different embodiments of the present invention. The results of the data detection process are provided from data detector circuit 440 as a data output 445. In addition, data output 445 is provided to phase error calculator circuit 450. Phase error calculator circuit 450 may be any circuit known in the art that is capable of identifying a sampling phase error based upon a difference between a detector input and a detector output. Phase error calculator circuit 450 provides a phase offset value 455 that is filtered by a second order filter 460 to yield a phase error value 462. Phase error value 462 represents an overall phase adjustment that would be expected to yield an ideal signal at the output of digital interpolation filter 420.

A phase change corresponding to phase error value 462 is implemented in part by a ADC phase selection circuit 490 providing a coarse phase feedback signal 475, and in part by an interpolation phase selection circuit 470 providing a fine phase feedback signal 465. ADC phase selection circuit 490 is operable to adjust the sampling phase at analog to digital converter 410 in increments of a "coarse step", and interpolation phase selection circuit 470 is operable to adjust the sampling phase at digital interpolation filter 420 in increments of a "fine step". Each sampling period (T) may be divided into a number of coarse sampling periods, and each of the coarse sampling periods may be divided into a number of fine sampling periods. The sampling resolution is defined by a combination of the fine sampling periods and the coarse sampling periods. Based upon the disclosure provided herein, one of ordinary skill in the art will recognize a variety of combinations of fine sampling periods and coarse sampling periods that may be accomplished in accordance with different embodiments of the present invention.

In particular, phase error value 462 is provided to ADC phase selection circuit 490 that generates a coarse phase feedback signal 375 in proportion to phase error value 462. In particular, where the magnitude of phase error value 462 is greater than one half of a coarse step, coarse phase feedback signal is incremented or decremented by an amount designed to compensate. For example, where phase error value 462 is 0.8 times a coarse step, coarse phase feedback signal 475 is incremented by one leaving the residual adjustment of −0.2 of a coarse step. As another example, where phase error value 462 is 1.2 times a coarse step, coarse phase feedback signal 475 is incremented by one leaving the residual adjustment of 0.2 of a coarse step. As yet another example, where phase error value 462 is 2.2 times a coarse step, coarse phase feedback signal 475 is incremented by two leaving the same residual adjustment of 0.2 of a coarse step. A similar pattern is true for negative phase adjustments. For example, where phase error value 462 is −0.8 times a coarse step, coarse phase feedback signal 475 is decremented by one leaving the residual adjustment of 0.2 of a coarse step. As another example, where phase error value 462 is −1.2 times a coarse step, coarse phase feedback signal 475 is decremented by one leaving the residual adjustment of −0.2 of a coarse step. As yet another example, where phase error value 462 is 2.2 times a coarse step, coarse phase feedback signal 475 is decremented by two leaving the same residual adjustment of −0.2 of a coarse step.

The residual adjustment is provided to interpolation phase selection circuit 470 as a residual value 492. Interpolation phase selection circuit 470 modifies an interim fine phase feedback signal 474 in accordance with the value of residual value 492, and provides the output as interim fine phase feedback signal 474. Interim fine phase feedback signal 474 is provided to a delay circuit 476. Delay circuit 476 assures that interim fine phase feedback signal 474 is not provided as fine phase feedback signal 465 until coarse phase feedback signal 475 has had a chance to propagate to digital samples 415. As such, the latency of the loop generating coarse feedback signal 475 is the same as the latency of the loop generating fine feedback signal 465.

Figure 5:
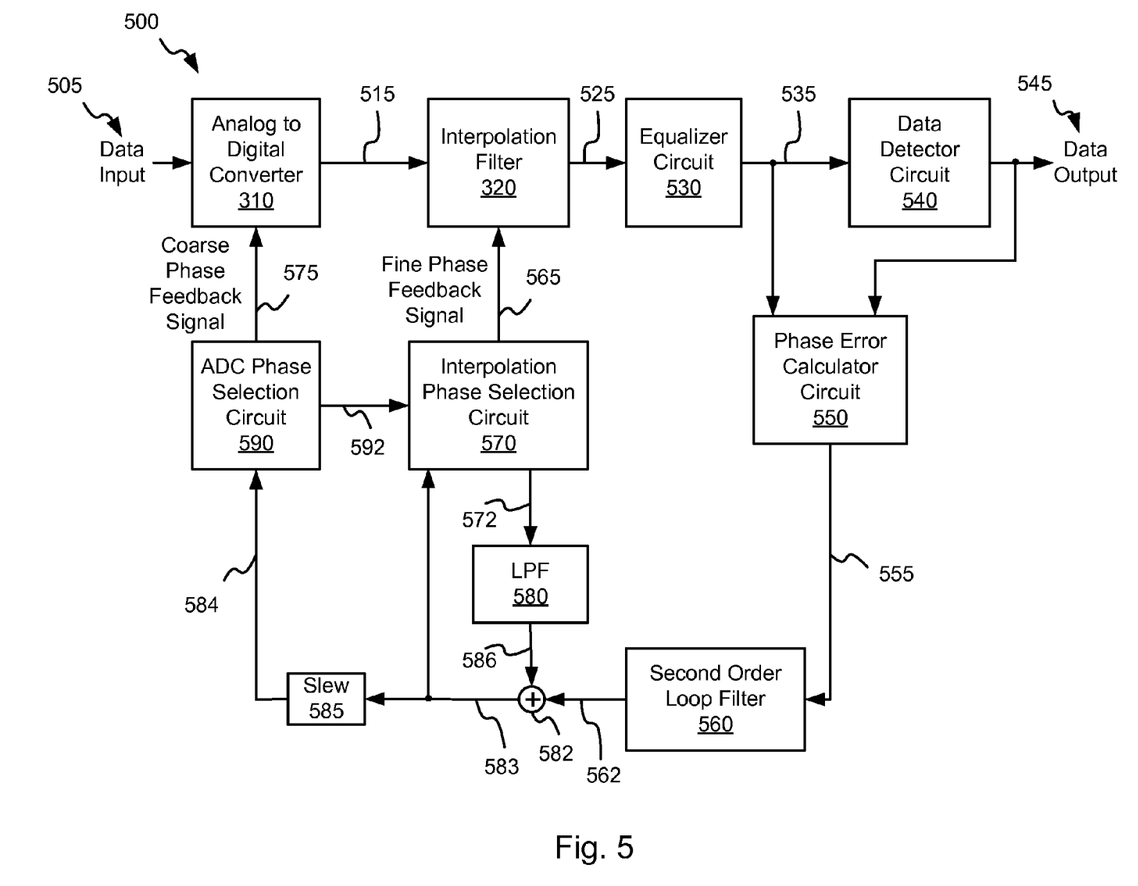
FIG. 5 shows yet another data processing system including a two-tier sampling phase update circuit in accordance with some embodiments of the present invention.

Turning to FIG. 5, yet another data processing system 500 including a two-tier sampling phase update circuit is shown in accordance with other embodiments of the present invention. Data processing system 500 compensates for the latency difference between performing a sampling phase update in the analog domain and performing a sampling phase update in the digital domain by incorporating an averaged fine tune adjustment in a the calculation of a coarse tune adjustment. This results in centering the fine tune adjustment around approximately zero, rather than a value driven by the latency difference. Further, data processing system 500 includes a slew rate limiting circuit 585 that limits the amount of change that can be applied via a coarse phase feedback signal 575 at any given time. Such a slew limiting circuit avoids instability that may be created by stepping coarse phase feedback signal 575 too much on any given pass.

Data processing system 500 includes an analog to digital converter 510 that receives a data input 505. Data input 505 is an analog data input that presents serial information to analog to digital converter 510. Data input 505 may be derived, for example, from a magnetic storage medium or from a transmission device. Based upon the disclosure provided herein, one of ordinary skill in the art will recognize a variety of sources from which data input 505 may be derived.

Analog to digital converter 510 samples data input 505 at a sampling phase governed by a coarse phase feedback signal 575. Analog to digital converter 510 may be any type of analog to digital converter known in the art. A series of digital samples 525 is provided from analog to digital converter 510 to a digital interpolation filter 520. Digital interpolation filter 520 selects one of a number of different samples corresponding to different phases depending upon a fine phase feedback signal 565. Digital interpolation filter 520 yields an interpolated output 525. An example of an interpolator circuit that may be used in place of interpolation filter 520 was discussed above in relation to FIG. 1b, or that described blow in relation to FIG. 6.

Interpolated output 525 is provided to an equalizer circuit 530, that may be any circuit known in the art that is capable of performing an equalizing function. Equalizer circuit 530 provides an original data input 535 to a data detector circuit 540. In addition, original data input 335 is provided to a phase error calculator circuit 550 as are known in the art. Data detector circuit 540 may be any data detector known in the art including, but not limited to, a MAP detector or a Viterbi algorithm detector. Based upon the disclosure provided herein, one of ordinary skill in the art will recognize a variety of data detector circuits that may be used in relation to different embodiments of the present invention. The results of the data detection process are provided from data detector circuit 540 as a data output 545. In addition, data output 545 is provided to phase error calculator circuit 550. Phase error calculator circuit 550 may be any circuit known in the art that is capable of identifying a sampling phase error based upon a difference between a detector input and a detector output. Phase error calculator circuit 550 provides a phase offset value 555 that is filtered by a second order filter 560 to yield a phase error value 562. Phase error value 562 represents an overall phase adjustment that would be expected to yield an ideal signal at the output of digital interpolation filter 520.

A phase change corresponding to phase error value 562 is implemented in part by a ADC phase selection circuit 590 providing a coarse phase feedback signal 575, and in part by an interpolation phase selection circuit 570 providing a fine phase feedback signal 565. ADC phase selection circuit 590 is operable to adjust the sampling phase at analog to digital converter 510 in increments of a "coarse step", and interpolation phase selection circuit 570 is operable to adjust the sampling phase at digital interpolation filter 520 in increments of a "fine step". Each sampling period (T) may be divided into a number of coarse sampling periods, and each of the coarse sampling periods may be divided into a number of fine sampling periods. The sampling resolution is defined by a combination of the fine sampling periods and the coarse sampling periods. Based upon the disclosure provided herein, one of ordinary skill in the art will recognize a variety of combinations of fine sampling periods and coarse sampling periods that may be accomplished in accordance with different embodiments of the present invention.

The magnitude of fine phase feedback signal 565 is provided as an output 572 to a low pass filter circuit 580. Low pass filter circuit 580 calculates an average of fine phase feedback signal 565 over a number of processed samples. As an example, low pass filter 580 maintains a running average of forty consecutive processed samples. The average of fine phase feedback signal 565 is provided as an average output 586 to a summation circuit 582. Summation circuit 582 adds average output 572 to phase error value 562 to yield a modified phase error value 584. By incorporating average output 586 with phase error value 562 any steady state value of fine phase feedback signal 565 due to a difference in the latency in updating coarse phase feedback signal 575 when compared with fine phase feedback signal 565 is subtracted resulting in modified phase error value 583. As such, the steady state value of fine phase feedback signal 565 is approximately zero. This maximizes the adjustment range of fine phase feedback signal 565.

Modified phase error value 583 is provided to a slew rate limiting circuit 585 that limits the magnitude of the phase error to avoid too large of a step on coarse phase feedback signal 575. For example, in some embodiments of the present invention, an allowable single step of coarse phase feedback signal 575 is limited to one coarse step. In such a case, slew rate limiting circuit 585 reduces the magnitude of modified phase error value 583 to be less than 1.5 coarse steps. The slew limited value is then provided to ADC phase selection circuit 590 as a slew limited phase error value 584.

Slew limited phase error value 584 is provided to ADC phase selection circuit 590 that generates coarse phase feedback signal 575 in proportion to slew limited phase error value 584. In particular, where the magnitude of slew limited phase error value 584 is greater than one half of a coarse step, coarse phase feedback signal is incremented or decremented by an amount designed to compensate. For example, where slew limited phase error value 584 is 0.8 times a coarse step, coarse phase feedback signal 575 is incremented by one leaving the residual adjustment of −0.2 of a coarse step. As another example, where slew limited phase error value 584 is 1.2 times a coarse step, coarse phase feedback signal 575 is incremented by one leaving the residual adjustment of 0.2 of a coarse step. A similar pattern is true for negative phase adjustments. For example, where slew limited phase error value 584 is −0.8 times a coarse step, coarse phase feedback signal 575 is decremented by one leaving the residual adjustment of 0.2 of a coarse step. As another example, where slew limited phase error value 584 is −1.2 times a coarse step, coarse phase feedback signal 575 is decremented by one leaving the residual adjustment of −0.2 of a coarse step.

The residual adjustment is provided to interpolation phase selection circuit 570 as a residual signal 592. Interpolation phase selection circuit 570 modifies fine phase feedback signal 565 in accordance with a combination of the value of residual value 592 and phase error value 562, and provides the output as fine phase feedback signal 565. The following pseudo code represents the operation of the combination of slew limiting circuit 585, ADC phase selection circuit 590, and interpolation phase selection filter 570:

```
/* Preliminary Coarse Adjustment */
If (Modified Phase Error Value 583 > 0){
    If (|Modified Phase Error Value 583| > 0.5*Coarse Step){
        Coarse Phase Feedback Signal 575 = Coarse
        Phase Feedback Signal 575 +1;
        Residual Value 592 = Modified Phase Error Value 583 − Coarse Step
    }
    Else {
        Coarse Phase Feedback Signal 175 = Coarse Phase
        Feedback Signal 175;
        Residual Value 592 = Modified Phase Error Value 583
    }
Else {
    If (|Modified Phase Error Value 583| > 0.5*Coarse Step){
        Coarse Phase Feedback Signal 175 = Coarse
        Phase Feedback Signal 175 −1;
        Residual Value 592 = Modified Phase Error
        Value 583 + Coarse Step
    }
    Else {
        Coarse Phase Feedback Signal 175 = Coarse
        Phase Feedback Signal 175;
        Residual Value 592 = Modified Phase Error Value 583
    }
/* Subsequent Fine Adjustment */
If (Modified Phase Error Value 583 > 0){
    If (|Modified Phase Error Value 583| > 1.5*Coarse Step){
        Set Fine Feedback Signal 565 to Maximum
    }
    Else {
        Set Fine Feedback Signal 565 to match Residual Value 592
    }
Else {
    If (|Updated Phase Offset Value| > 1.5*Coarse Step){
```

```
    Set Fine Feedback Signal 165 to Minimum
}
Else {
    Set Fine Feedback Signal 165 to match Residual Value 592
}
```

It should be noted that similar slew limiting may be applied to data processing system 400 of FIG. 4.

Figure 6A:
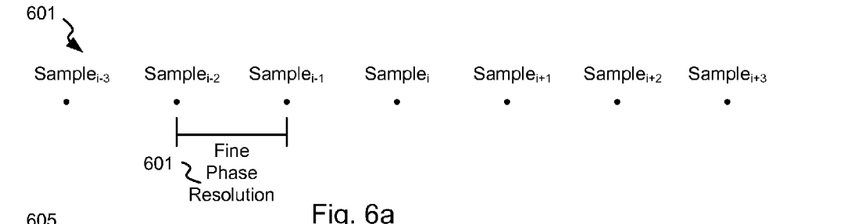
FIG. 6a shows a number of evenly distributed samples used for digital interpolation.

Turning to FIG. 6*a* a number of evenly distributed samples 601 are depicted that may be used for digital interpolation. The samples are separated by a fine phase resolution 603. It should be noted that while seven samples are show, that more or fewer samples may be used in relation to different embodiments of the present invention. Such evenly distributed samples occur when there is no change in a coarse phase feedback signal.

Figure 6B:
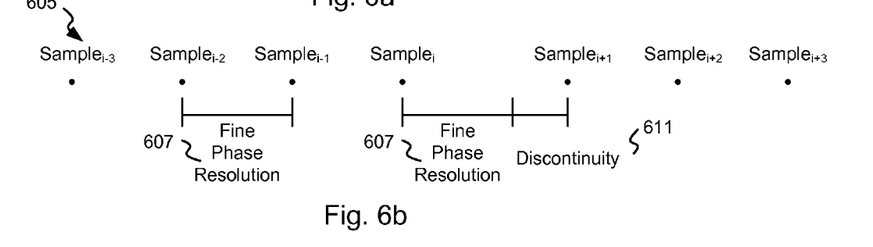
FIG. 6b shows a number of samples that are generally distributed evenly, but exhibit a discontinuity due to a change in a coarse adjustment in accordance with some embodiments of the present invention.

FIG. 6*b* shows a number of samples 605 that are generally distributed evenly, but exhibit a discontinuity 611 between two successive samples due to a change in a coarse adjustment in accordance with some embodiments of the present invention. The samples are generally separated by a fine phase resolution 607, except for the samples spanning the change in the coarse adjustment. Where the coarse adjustment occurs, the samples are separated by fine phase resolution 607 plus discontinuity 611. Again, it should be noted that while seven samples are show, that more or fewer samples may be used in relation to different embodiments of the present invention. It should also be noted that while discontinuity 611 is shown as positive, it can be negative such that the separation between the samples is phase resolution 607 minus the magnitude of discontinuity 611.

Figure 6C:
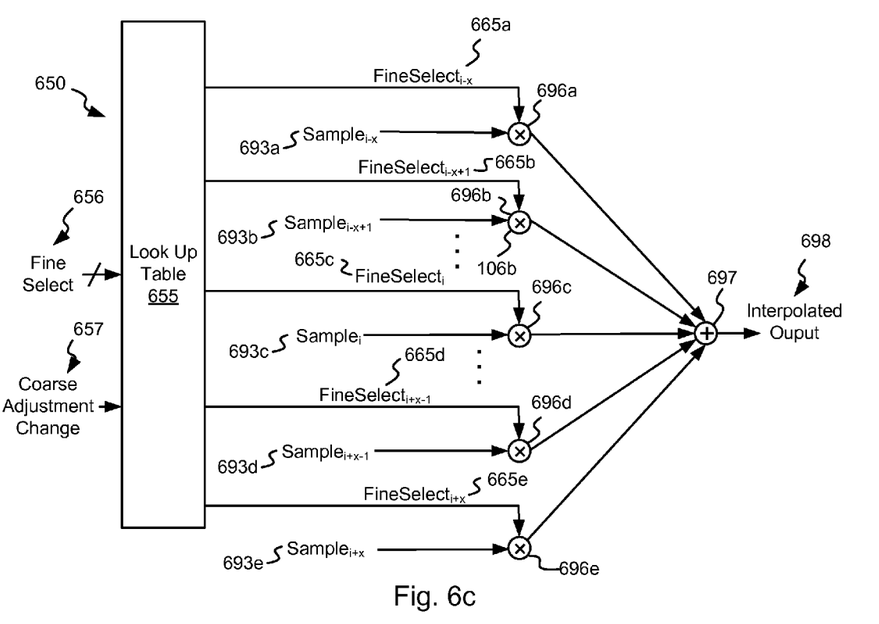
FIG. 6c depicts a digital interpolator circuit designed to compensate for discontinuities created by changes in a coarse phase adjustment in accordance with various embodiments of the present invention.

Turning to FIG. 6*c*, a digital interpolator circuit 650 designed to compensate for discontinuities created by changes in a coarse phase adjustment is depicted in accordance with various embodiments of the present invention. Digital interpolator circuit 650 includes a number of multiplier circuits 696, where the number of multiplier circuits 696 corresponds to the number of possible samples 693 and the number of fine select signals 665. Multiplier circuits 696 multiply respective ones of fine select signals 665 by samples 693. The products of the respective multiplications are summed together using a summation circuit 697 to yield interpolated output 698. As an example, where fine select signals 665 are asserted such that fine select signal 665*d* and fine select signal 665*e* are both set to a value of 0.5, and the other instances of fine phase feedback signals 665 are set to a value of '0', interpolated output 698 is the average of sample 603*d* and sample 603*e*.

Fine select signals 665 are provided from a look up table 655 that provides values based upon a fine phase feedback signal 656 and a coarse adjustment change signal 657. Coarse adjustment change signal 657 indicates a magnitude and direction of a change in a coarse phase feedback signal. Where there is no change in the coarse phase feedback signal (i.e., coarse adjustment change signal 657 is zero), there is no discontinuity in samples 693. As such, the values provided as fine select signals 665 correspond to fine phase feedback signal 656 similar to that in FIG. 1*b* above.

In contrast, where there is a change in the coarse phase feedback signal (i.e., coarse adjustment change signal 657 is non-zero), there may be a discontinuity in samples 693. To adjust for the discontinuity, values provided as fine select signals 665 correspond to fine phase feedback signal 656 adjusted for the discontinuity. Thus, for example, where fine phase feedback signal 656 is set to select a value exactly half way between two samples where a discontinuity occurs, the values provided are not simply 0.5 times one sample and 0.5 times another sample as before, but are adjusted to account for the discontinuity. As the occasion and magnitude of discontinuity can be determined ahead of time, look up table 655 can programmed to provided the adjusted values.

Figure 7:
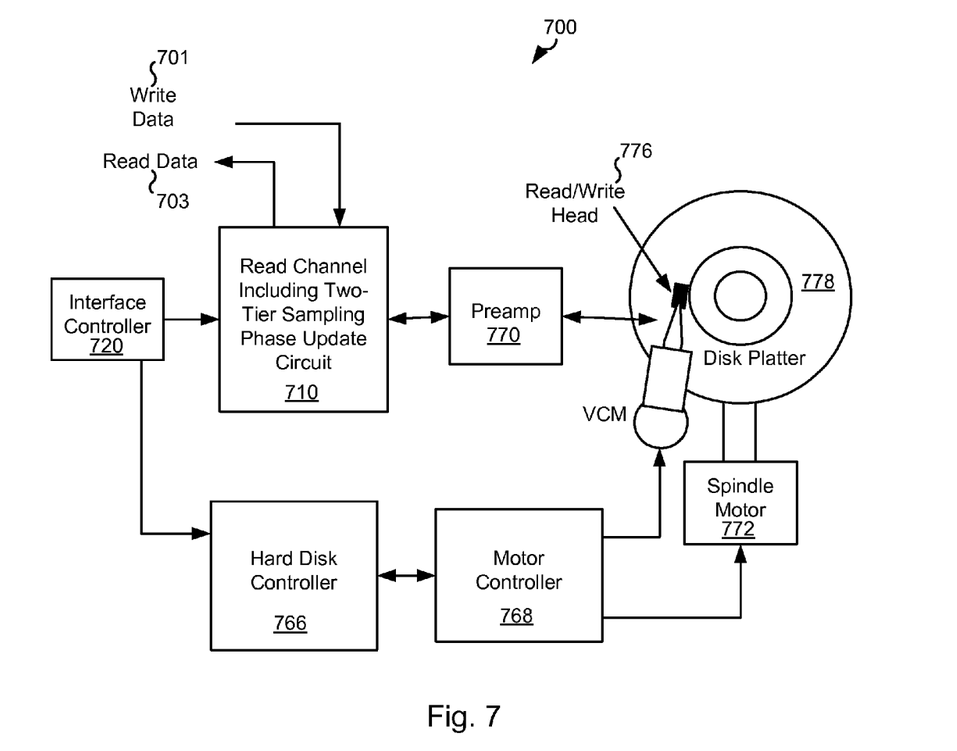
FIG. 7 depicts a storage system including a reduced latency data retrieval system in accordance with various embodiments of the present invention.

Turning to FIG. 7, a storage system 700 including a two-tier sampling phase update circuit is shown in accordance with various embodiments of the present invention. Storage system 700 may be, for example, a hard disk drive. Storage system 700 includes a read channel 710 with an incorporated two-tier sampling phase update circuit. The incorporated two-tier sampling phase update circuit may be any sampling update circuit capable of modifying both an interpolation phase and an ADC sampling phase. Thus, for example, the incorporated two-tier sampling phase update circuit may be, but is not limited to, any of those described in relation to FIG. 1, FIG. 3, FIG. 4 and FIG. 5 above. In addition, storage system 700 includes an interface controller 720, a preamp 770, a hard disk controller 766, a motor controller 768, a spindle motor 772, a disk platter 778, and a read/write head 776. Interface controller 720 controls addressing and timing of data to/from disk platter 778. The data on disk platter 778 consists of groups of magnetic signals that may be detected by read/write head assembly 776 when the assembly is properly positioned over disk platter 778. In a typical read operation, read/write head assembly 776 is accurately positioned by motor controller 768 over a desired data track on disk platter 778. Motor controller 768 both positions read/write head assembly 776 in relation to disk platter 678 and drives spindle motor 772 by moving read/write head assembly to the proper data track on disk platter 778 under the direction of hard disk controller 766. Spindle motor 772 spins disk platter 778 at a determined spin rate (RPMs).

Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel module 764 via preamp 770. Preamp 770 is operable to amplify the minute analog signals accessed from disk platter 778. In addition, preamp 770 is operable to amplify data from read channel module 710 that is destined to be written to disk platter 778. In turn, read channel module 710 decodes and digitizes the received analog signal to recreate the information originally written to disk platter 778. This data is provided as read data 703 to a receiving circuit. A write operation is substantially the opposite of the preceding read operation with write data 701 being provided to read channel module 710. This data is then encoded and written to disk platter 778.

Figure 8:
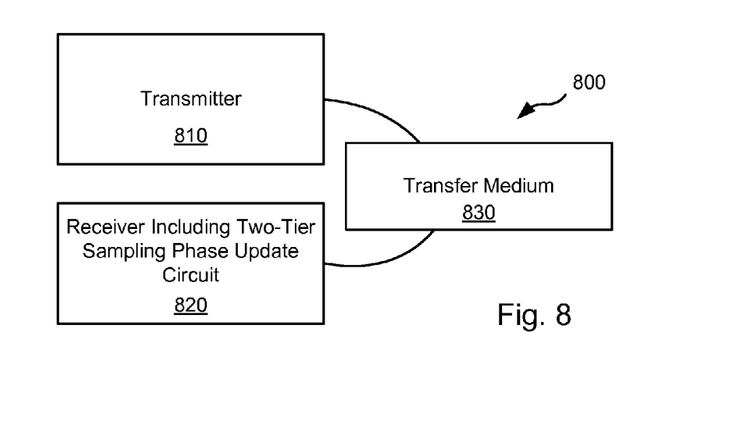
FIG. 8 depicts a communication system including a reduced latency data retrieval system in accordance with one or more embodiments of the present invention.

Turning to FIG. 8, a communication system 800 including a receiver 820 with a two-tier sampling phase update circuit in accordance with one or more embodiments of the present invention is shown. Communication system 800 includes a transmitter that is operable to transmit encoded information via a transfer medium 830 as is known in the art. The encoded data is received from transfer medium 830 by receiver 820. Receiver 820 incorporates a reduced latency data retrieval system. The incorporated two-tier sampling phase update circuit may be any sampling update circuit capable of modifying both an interpolation phase and an ADC sampling phase. Thus, for example, the incorporated a reduced latency data retrieval system may be, but is not limited to, any of those described in relation to FIG. 1, FIG. 3, FIG. 4 and FIG. 5 above.

In conclusion, the invention provides novel systems, devices, methods and arrangements for updating sampling phase in a data detector feedback loop. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the circuit comprising:
    an analog to digital converter, wherein the analog to digital converter is operable to sample an analog data input at a sampling phase governed at least in part by a coarse control, and wherein the analog to digital converter is operable to provide a series of digital samples;
    a digital interpolation circuit, wherein the digital interpolation circuit is operable to interpolate between a subset of the series of digital samples based at least in part on a fine control;
    a phase error circuit, wherein the phase error circuit is operable to calculate a phase error value;
    a phase adjustment control circuit, wherein the phase adjustment control circuit is operable to determine the coarse control and the fine control based at least in part on the phase error value; and
    a data processing circuit operable to receive a digital data input derived from the digital interpolation circuit and to provide a processed output;
    wherein the phase error circuit is operable to receive the digital data input derived from the digital interpolation circuit and the processed output, and wherein the phase error circuit is operable to calculate the phase error value based at least in part on a difference between the digital data input derived from the digital interpolation circuit and the processed output.

2. The circuit of claim 1, wherein the data processing circuit includes a data detection circuit, and wherein the data detection circuit is selected from a group consisting of: a Viterbi algorithm detector and a MAP detector.

3. The circuit of claim 1, wherein the phase adjustment control circuit includes a coarse tune error feedback circuit and a fine tune error feedback circuit, wherein the coarse tune feedback circuit is operable to generate the coarse control based at least in part on the phase error value, and wherein the fine tune error feedback circuit is operable to generate the fine control based at least in part on a residual value provided from the coarse tune feedback signal.

4. The circuit of claim 3, wherein the phase adjustment control circuit includes a latency adjustment circuit, wherein the latency adjustment circuit is operable to reduce the effect of a latency difference between applying the coarse control and applying the fine control.

5. The circuit of claim 4, wherein the latency adjustment circuit includes a low pass filter and a summation circuit, wherein the low pass filter is operable to provide an average value of the fine control to a summation element where it is summed with the phase error value to yield a modified error value, and wherein the coarse tune feedback circuit is operable to generate the coarse control based at least in part on the modified error value.

6. The circuit of claim 4, wherein the latency adjustment circuit includes a delay circuit, wherein the delay circuit is operable to delay application of the fine control to the digital interpolation circuit to match any delay in propagating the coarse control to the series of data samples provided to the digital interpolation filter.

7. The circuit of claim 1, wherein the digital interpolation circuit is operable to compensate for a discontinuity between two of the subset of the series of digital samples caused by a change in the coarse control.

8. The circuit of claim 7, wherein the digital interpolation circuit includes a lookup table with pre-calculated fine select values selectable based upon the fine control and a change in the coarse control.

9. The circuit of claim 1, wherein the circuit further comprises:
    a slew rate limiting circuit, wherein the slew rate limiting circuit is operable to limit an incremental change that may be made to the coarse control by the phase adjustment control circuit.

10. The circuit of claim 1, wherein the circuit is implemented in an integrated circuit.

11. The circuit of claim 1, wherein the circuit is implemented as part of a storage device.

12. The circuit of claim 11, wherein the storage device is a hard disk drive.

13. A method for sample phase adjustment in a data processing system, the method comprising:
    performing an analog to digital conversion of an analog data input at a sampling phase governed at least in part by a coarse control, wherein the analog to digital conversion yields a series of digital samples;
    performing a digital interpolation of the series of digital samples, wherein the digital interpolation interpolates between a subset of the series of digital samples based at least in part on a fine control, and wherein the digital interpolation provides a series of interpolated values;
    performing a data detection on a derivative of the series of interpolated values to yield an ideal output;
    calculating a phase error based at least in part on the ideal output and the derivative of the series of interpolated values;
    updating the coarse control based at least in part on the phase error;
    calculating a residual value based at least in part on the phase error; and
    updating the fine control based at least in part on the residual value.

14. The method of claim 13, wherein the data detection is selected from a group consisting of: a Viterbi algorithm detection process and a maximum a posteriori (MAP) detection process.

15. The method of claim 13, wherein updating the coarse control includes decrementing the coarse control when the phase error is greater than one half of a coarse step.

16. The method of claim 15, wherein calculating the residual value includes subtracting the value decremented from the coarse control multiplied by the coarse step from the phase error.

17. The method of claim 13, wherein updating the coarse control includes incrementing the coarse control when the phase error is negative and the magnitude of the phase error greater than one half of a coarse step.

18. The method of claim 17, wherein calculating the residual value includes adding the value incremented to the coarse control multiplied by the coarse step to the phase error.

19. The method of claim 13, wherein the method further includes:

limiting an incremental change that may be made to the coarse control.

20. A data processing system, the data processing system comprising:
   an analog to digital converter, wherein the analog to digital converter samples an analog data input at a sampling phase governed at least in part by a coarse control, and wherein the analog to digital converter provides a series of digital samples;
   a digital interpolation circuit, wherein the digital interpolation circuit interpolates between a subset of the series of digital samples based at least in part on a fine control;
   a data processing circuit, wherein the data processing circuit receives a digital data input derived from the digital interpolation circuit and provides a processed output;
   a phase error circuit, wherein the phase error circuit calculates a phase error value based at least in part on a difference between the processed output and the digital data input derived from the digital interpolation circuit; and
   a phase adjustment control circuit, wherein the phase adjustment control circuit is operable to determine the coarse control and the fine control based at least in part on the phase error value.

21. The data processing system of claim 20, wherein the data processing system is incorporated in a hard disk drive, and wherein the analog data input is derived from a magnetic storage medium.

22. The data processing system of claim 20, wherein the data processing system is incorporated in a data transmission system, and wherein the analog data input is derived from a data transfer medium.

23. A data processing circuit, the circuit comprising:
   an analog to digital converter operable to sample an analog data input at a sampling phase governed at least in part by a coarse control, and to provide a corresponding series of digital samples;
   a digital interpolation circuit operable to interpolate between a subset of the series of digital samples based at least in part on a fine control;
   a phase error circuit operable to calculate a phase error value; and
   a phase adjustment control circuit operable to determine the coarse control and the fine control based at least in part on the phase error value, wherein the phase adjustment control circuit includes a coarse tune error feedback circuit and a fine tune error feedback circuit, wherein the coarse tune feedback circuit is operable to generate the coarse control based at least in part on the phase error value, and wherein the fine tune error feedback circuit is operable to generate the fine control based at least in part on a residual value provided from the coarse tune feedback signal.

24. The circuit of claim 23, wherein the phase adjustment control circuit includes a latency adjustment circuit, wherein the latency adjustment circuit is operable to reduce the effect of a latency difference between applying the coarse control and applying the fine control.

25. The circuit of claim 24, wherein the latency adjustment circuit includes a low pass filter and a summation circuit, wherein the low pass filter is operable to provide an average value of the fine control to a summation element where it is summed with the phase error value to yield a modified error value, and wherein the coarse tune feedback circuit is operable to generate the coarse control based at least in part on the modified error value.

26. The circuit of claim 24, wherein the latency adjustment circuit includes a delay circuit, wherein the delay circuit is operable to delay application of the fine control to the digital interpolation circuit to match any delay in propagating the coarse control to the series of data samples provided to the digital interpolation filter.

27. The circuit of claim 23, wherein the digital interpolation circuit is operable to compensate for a discontinuity between two of the subset of the series of digital samples caused by a change in the coarse control, and wherein the digital interpolation circuit includes a lookup table with pre-calculated fine select values selectable based upon the fine control and a change in the coarse control.

28. The circuit of claim 23, wherein the circuit further comprises:
   a slew rate limiting circuit operable to limit an incremental change that may be made to the coarse control by the phase adjustment control circuit.

29. A data processing circuit, the circuit comprising:
   an analog to digital converter operable to sample an analog data input at a sampling phase governed at least in part by a coarse control, and to provide a corresponding series of digital samples;
   a digital interpolation circuit operable to interpolate between a subset of the series of digital samples based at least in part on a fine control;
   a phase error circuit operable to calculate a phase error value;
   a phase adjustment control circuit operable to determine the coarse control and the fine control based at least in part on the phase error value; and
   a slew rate limiting circuit operable to limit an incremental change that may be made to the coarse control by the phase adjustment control circuit.

* * * * *